United States Patent
Matsumoto

(12) 
(10) Patent No.: US 6,218,287 B1
(45) Date of Patent: Apr. 17, 2001

(54) METHOD OF FABRICATING A SEMICONDUCTOR STRUCTURE

(75) Inventor: Akira Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/435,839

(22) Filed: Nov. 8, 1999

(30) Foreign Application Priority Data

Nov. 6, 1998 (JP) .................................................. 10-316546

(51) Int. Cl.⁷ .................................................. H01L 21/4763
(52) U.S. Cl. .................... 438/624; 438/637; 438/648; 438/672; 438/740
(58) Field of Search .................................... 438/622, 624, 438/637, 638, 648, 672, 738, 740

(56) References Cited

U.S. PATENT DOCUMENTS

| | | | |
|---|---|---|---|
| 4,789,648 | 12/1988 | Chow et al. | 438/624 |
| 5,818,110 * | 10/1998 | Cronin | 257/775 |
| 5,976,972 * | 11/1999 | Inohara et al. | 438/640 |
| 6,025,259 * | 2/2000 | Yu et al. | 438/622 |
| 6,071,806 * | 6/2000 | Wu et al. | 438/622 |
| 6,071,809 * | 6/2000 | Zhao | 438/634 |
| 6,083,822 * | 7/2000 | Lee | 438/624 |
| 6,093,632 * | 7/2000 | Lin | 438/618 |
| 6,143,646 * | 11/2000 | Wetzel et al. | 438/637 |

* cited by examiner

Primary Examiner—T. N. Quach
(74) Attorney, Agent, or Firm—McGinn & Gibb, PLLC

(57) ABSTRACT

On a substrate is provided a layered structure of a lower insulating layer, a lower etch stop layer, an upper insulating layer and an upper etch stop layer. A via hole is formed in a location above a doped region of the substrate, the via hole extending through the upper etch stop layer and the upper insulating layer to the lower etch stop layer. On the upper etch stop layer is placed a photoresist layer having a trench pattern to produce a replica of the trench pattern, followed by removal of any of the photoresist layer. A portion of the upper insulating layer is then removed through the replica of the trench pattern to form a wire trench and a portion of the lower insulating layer is removed through the removed portion of the lower etch stop layer so that the via hole is extended to the doped region. The upper etch stop layer is removed and a portion of the lower etch stop layer is removed simultaneously through the wire trench. Finally, metal is then deposited in the via hole and the wire trench.

12 Claims, 5 Drawing Sheets

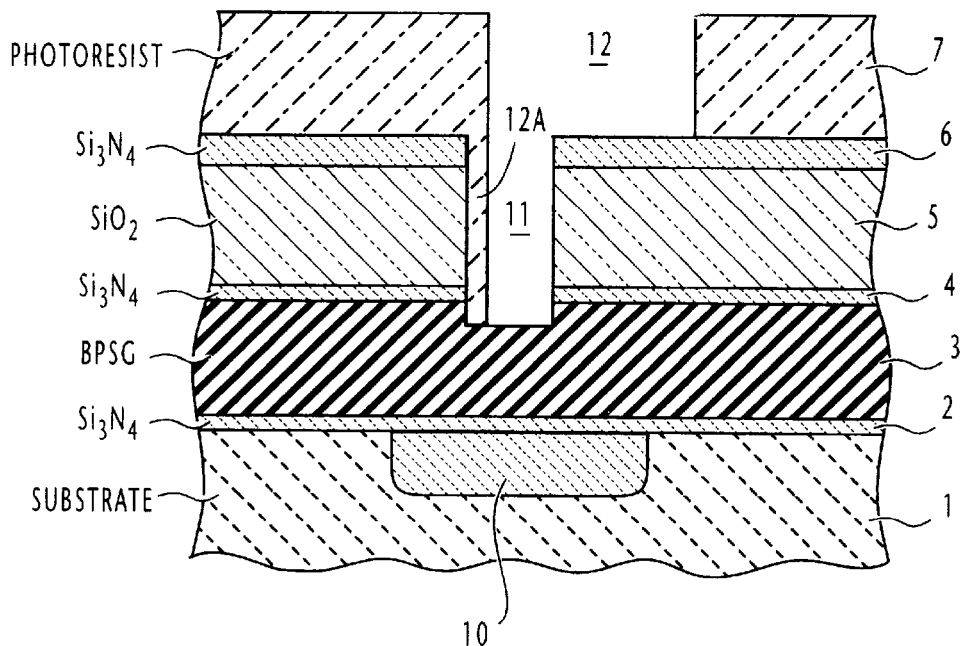
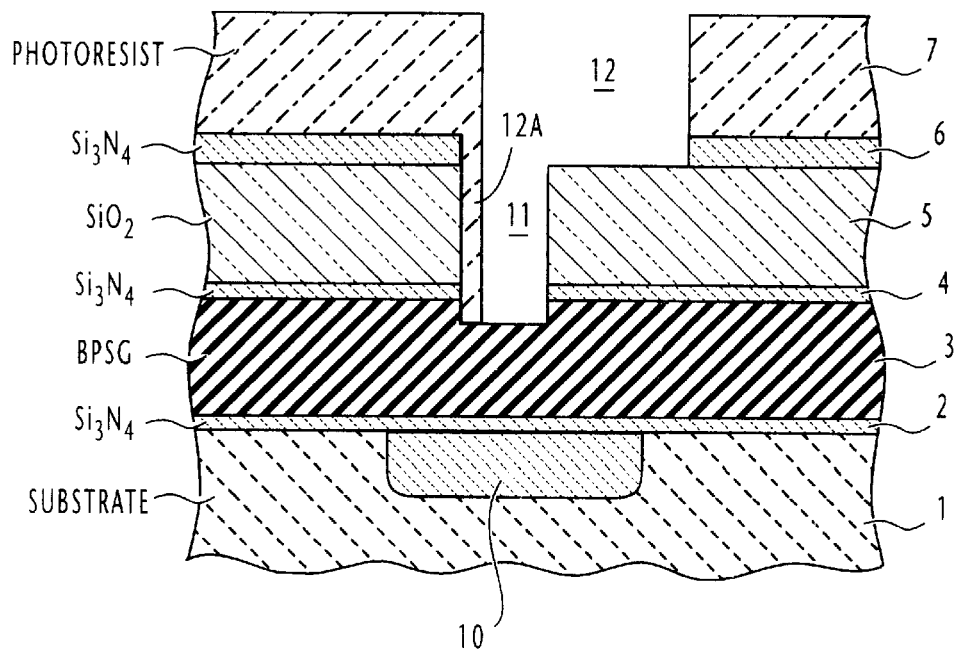

METHOD OF FABRICATING A SEMICONDUCTOR STRUCTURE

BACKGROUND OF THE INVENTION

1. Field of the Invention

The present invention relates generally to the deposition of metal on a semiconductor structure, and more specifically to a method of fabricating a semiconductor structure in which metal is deposited to from an improved via connection despite misalignment between via hole and trench pattern.

2. Description of the Related Art

U.S. Pat. No. 4,789,648 issued to M. M Chow et al discloses a method of depositing metal on a semiconductor structure. According to this prior art, a layered structure of insulating material is provided on a semiconductor substrate in which a layer of metallization is formed. The layered insulator structure consists of a etch stop layer sandwiched between lower and upper insulating layers. The etch stop layer has a window. A photoresist layer having a trench pattern is then deposited on the structure and the portion of the upper insulating layer is etched through the trench pattern to form a wire trench. The etching process is continued to etch the portion of the lower insulating layer through the window of the etch stop layer down to the layer of metallization to form a via hole. Metal is then deposited into the via hole and the wire trench to complete a via connection between the metallization and the conductor in the wire trench.

However, if the trench pattern is misaligned with the window of the etch stop layer, the effective contact area of the metal in the via hole and the metal in the wire trench is reduced. Such a reduced contact area is a potential source of failures.

Further, the etch stop layer is exposed to etching gas while the etching process is continued to form the via hole. Therefore, the etch stop layer must be of a material capable of withstanding erosion under the etching gas, and hence the material that forms the wire trench has a high dielectric constant. As a result, the parasitic capacitance between adjacent wire conductors increases to the detriment of high speed performance of semiconductor devices.

SUMMARY OF THE INVENTION

It is therefore an object of the present invention to provide a method of fabricating a semiconductor structure which ensures a via connection with no reduced contact area, despite misalignment.

A further object of the present invention is to provide a method of fabricating a semiconductor structure which ensures low dielectric constant for wire conductors in order to achieve high speed operation of the semiconductor device.

According to a first aspect of the present invention, there is provided a method of fabricating a semiconductor structure, comprising the steps of providing a substrate having a doped region, forming a successively layered structure on the substrate, the layered structure comprising a lower insulating layer, a lower etch stop layer, an upper insulating layer and an upper etch stop layer, forming a via hole above the doped region, the via hole extending through the upper etch stop layer and the upper insulating layer to the lower etch stop layer, forming, on the upper etch stop layer, a photoresist layer having a trench pattern, forming a replica of the trench pattern on the upper etch stop layer, removing any of the photoresist layer, simultaneously removing a portion of the upper insulating layer through the replica of the trench pattern to form a wire trench and a portion of the lower insulating layer through the removed portion of the lower etch stop layer to extend the via hole to the doped region, simultaneously removing the upper etch stop layer and a portion of the lower etch stop layer through the wire trench, and depositing metal in the via hole and the wire trench.

According to a second aspect, the present invention provides a method of fabricating a semiconductor structure, comprising the steps of providing a substrate having a doped region, forming a successively layered structure on the substrate, the layered structure comprising a lower etch stop layer, a lower insulating layer, a middle etch stop layer, an upper insulating layer and an upper etch stop layer, forming a via hole above the doped region, the via hole extending through the upper etch stop layer, the upper insulating layer to the middle etch stop layer, forming, on the upper etch stop layer, a photoresist layer having a trench pattern, forming a replica of the trench pattern on the upper etch stop layer, removing any of the photoresist layer, simultaneously removing a portion of the upper insulating layer through the replica of the trench pattern to form a wire trench and removing a portion of the lower insulating layer through the removed portion of the middle etch stop layer to extend the via hole to the lower etch stop layer, simultaneously removing the upper etch stop layer, a portion of the middle etch stop layer through the wire trench and a portion of the lower etch stop layer through the via hole, and depositing metal in the via hole and the wire trench.

BRIEF DESCRIPTION OF THE DRAWINGS

The present invention will be described in further detail with reference to the accompanying drawings, in which:

FIGS. 1 to 9 are cross-sectional views illustrating process steps employed in the present invention for fabricating a semiconductor structure.

DETAILED DESCRIPTION

Figure 1:
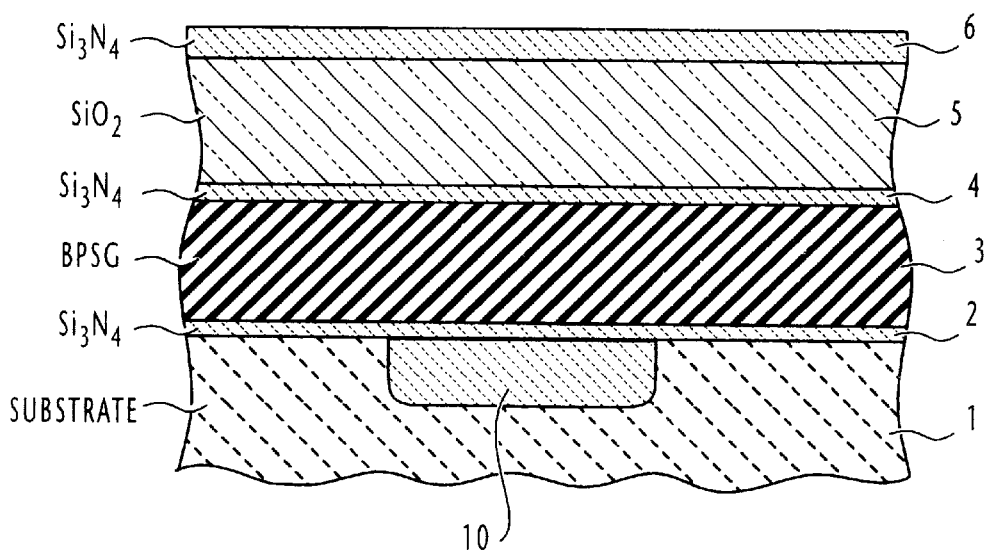

FIG. 1 shows a semiconductor structure of the present invention. The semiconductor structure of this invention is comprised of a substrate 1 of a predetermined conductivity type on which a plurality of impurity doped regions are formed. One of such doped regions 10 is illustrated. A lower etch stop layer 2 of silicon nitride ($Si_3N_4$) is deposited on the substrate to a thickness of 500 angstrom. On the silicon nitride layer 2 is a borophosphosilicate glass (BPSG) layer 3 with a thickness of 12,000 angstrom, which is provided as a lower insulating layer. The BPSG layer 3 is planalized by a chem-mech (chemical-mechanical) polishing technique to a thickness of 7,000 angstrom. A middle etch stop layer 4 of silicon nitride is formed on the lower insulating layer 3 to a thickness of 500 angstrom. Standard plasma CVD (chemical vapor deposition) technique is then used to form a 5000-angstrom thick silicon dioxide ($SiO_2$) layer 5 over the middle etch stop layer 4 to serve as an upper insulating layer. Finally, an upper etch stop layer 6 of silicon nitride is deposited to a thickness greater than the thickness of either of the middle and lower etch stop layers. Typically, the etch stop layer 6 has a thickness of 1000 angstrom. Instead of using a larger thickness value than etch stop layers 2 and 4, the upper etch stop layer 6 may be formed of a material more etch-tolerant than the other etch stop layers 2 and 4. Depending on applications, the lower etch stop layer 2 may be dispensed with.

Figure 2:
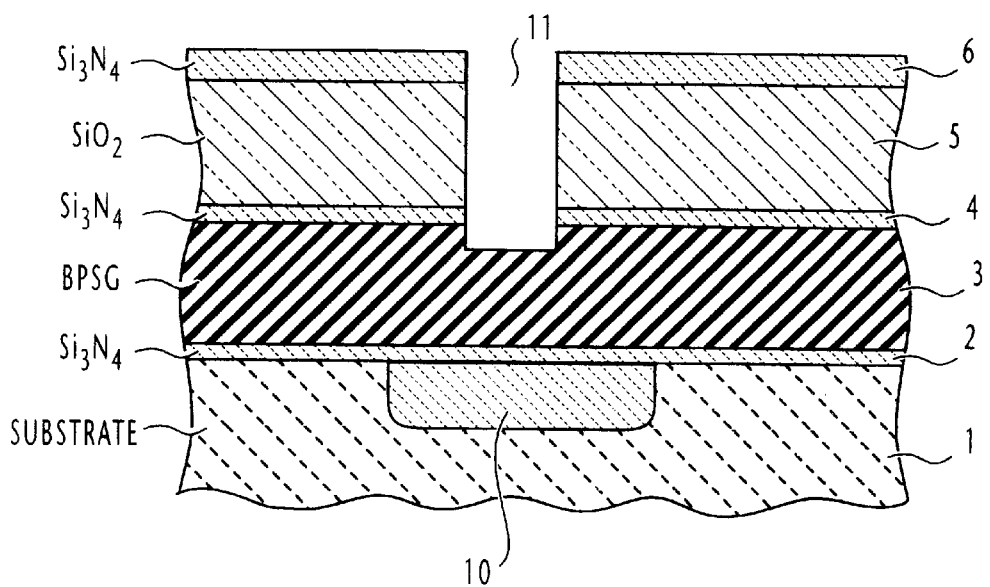

A via hole 11 is then formed on the layered structure of FIG. 1 by standard photolithography and inisotropic dry etching process, as shown in FIG. 2, using a gaseous mixture of $C_4F_8/Ar/O_2$. This via hole extends through the upper etch stop layer 6, the upper insulating layer 5 and the middle etch stop layer 4. Preferably, the via hole extends partially into the lower insulating layer 3.

On the layered structure of FIG. 2 is deposited a photoresist layer 7 having a trench pattern 12, as shown in FIG. 3. Ideally, the center line of trench pattern 12 is aligned with the center axis of via hole 11. However, due to possible misalignment, the via hole 11 may be partially filled with resist material as indicated by numeral 12A.

Photoresist layer 7 is then used as a mask for inisotropically dry etching a portion of the upper etch stop layer 6 that is exposed to the outside through the trench pattern 12, as shown in FIG. 4. In this dry etching process, a gaseous mixture of $CHF_3/O_2$ is employed.

Figure 5:
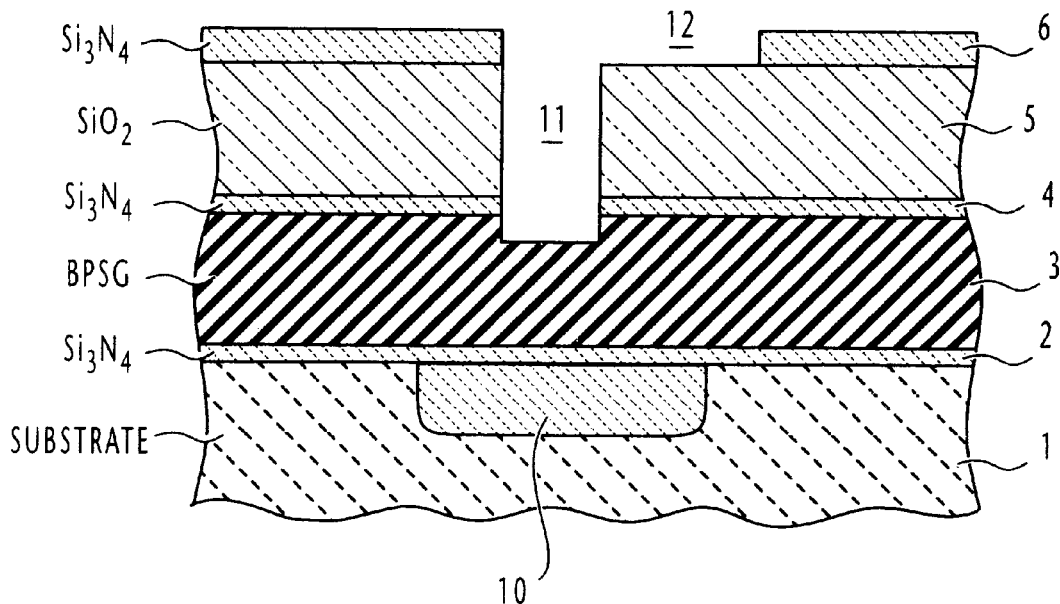

Photoresist layer 7 is then removed as shown in FIG. 5, revealing a replica of the trench pattern 12 on the upper etch stop layer 6. It is seen that by the removal of photoresist layer 7 the resist material 12A is also removed from the via hole 11. Despite the misalignment, the trench pattern 12 and the via hole 11 are aligned edge-to-edge.

Figure 6:
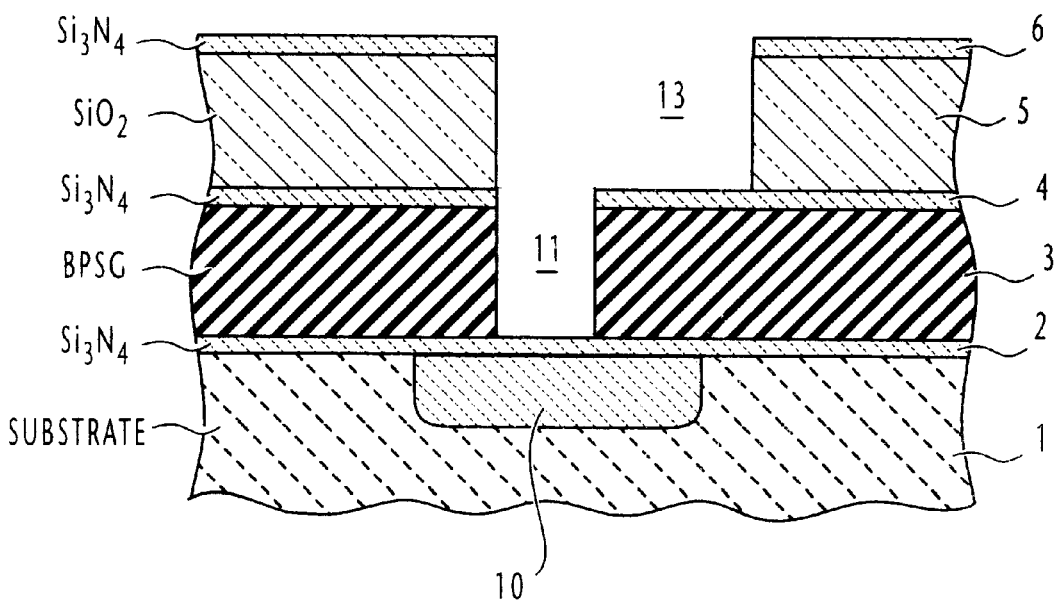

The replica of the trench pattern 12 formed by the upper etch stop layer 6 is then used as a mask for removing a portion of the upper insulating layer 5 and a portion of the lower insulating layer 3 by an inisotropic dry etching technique using a gaseous mixture of $C_4F_8/CO/Ar/O_2$. As shown in FIG. 6, the etching of upper insulating layer 5 terminates at the middle etch stop layer 4. At the same time the etching of the lower insulating layer 3 terminates at the lower etch stop layer 2. As a result, a wire trench 13 is formed on the exposed portion of the middle etch stop layer 4 and the via hole 11 extends down to the lower etch stop layer 2 or to the doped region 10 if the layer 2 is not provided. Since the upper etch stop layer 6 is also exposed to the etching gas, this layer is etched to the same thickness as the other etch stop layers 2 and 4, as shown in FIG. 6.

If the etch stop layer 6 is more etch-tolerant than the other etch stop layers, this layer may not be etched to the same thickness as the other etch stop layers 2 and 4. In this case, the thickness of etch stop layer 6 is determined with respect to the thickness of the other etch stop layers so that all etch stop layers are simultaneously etched to their full thickness when the layered structure is exposed to an etching process which will follow.

Since the lower and middle etch stop layers 2 and 4 are not exposed to etching gas during the etching of layers 3 and 5, the thickness value of 500 angstrom is considered to be sufficient for the etch stop layers 2 and 4. For this reason, the standard low temperature plasma CVD technique can be advantageously used for the deposition of etch stop layers 2 and 4.

Figure 7:
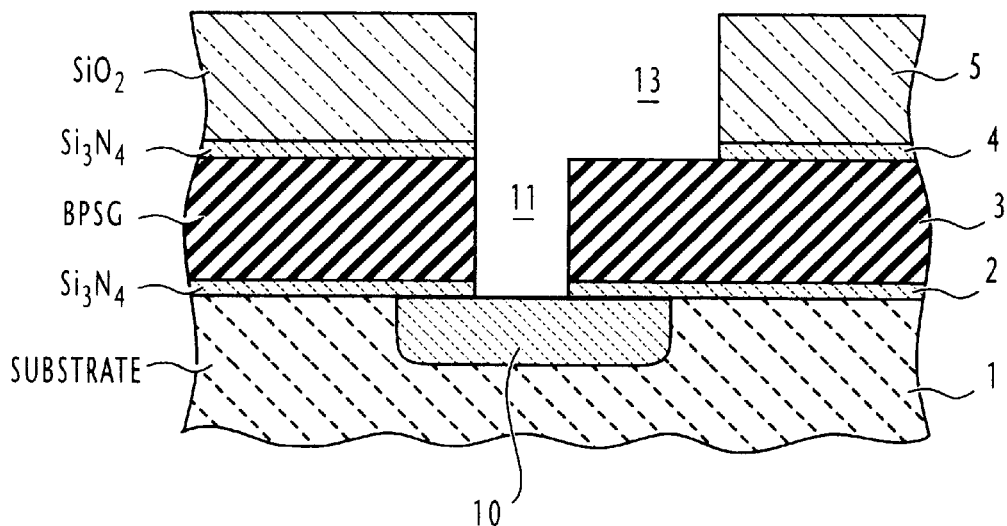

An etching process then follows to remove the upper etch stop layer 6, a portion of the middle etch stop layer 4 that is exposed through the wire trench 13 and a portion of the lower etch stop layer 2 that is exposed through the via hole 11, as shown in FIG. 7. An etching gas of $CHF_3/O_2$ is used for this process. Oxide materials which may be formed within the via hole 11 by spontaneous oxidation are purged by the use of an argon ion sputtering technique. Since the portion of middle etch layer 4 that defined the via hole 11 is removed and the underlying insulating layer 3 is exposed, the materials forming the wire trench 13 has a low value of dielectric constant. Capacitance between adjacent wire conductors of a semiconductor device is therefore reduced, which is of benefit to high speed operation.

Figure 8:
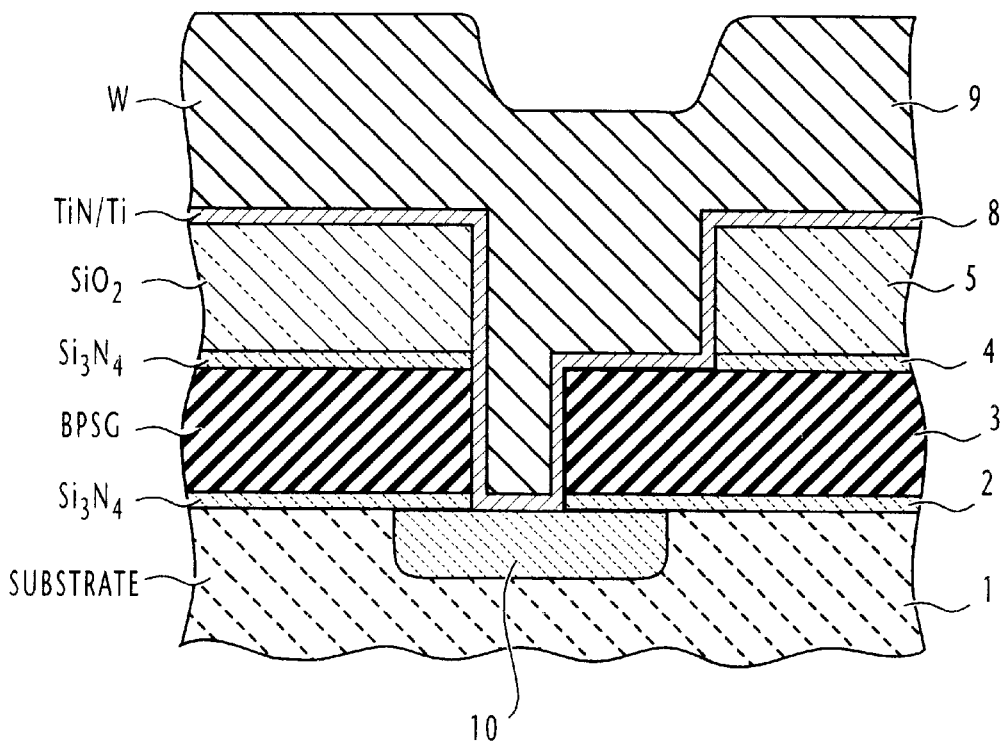

Over the layered structure of FIG. 7, a thin film of metallic substance such as titanium nitride or titanium (TiN/Ti) is deposited as shown in FIG. 8. The thin metallic film 8 serves as an intimate contact between the doped region 10 and a metal with which the via hole and the wire trench are filled. A preferred filling metal is tungsten, which is grown on the thin-film coated structure by a CVD technique to form a metal layer 9 to a thickness of 8,000 angstrom. In this way, a via connection is established between the doped region 10 and the metal in the wire trench 13.

Figure 9:
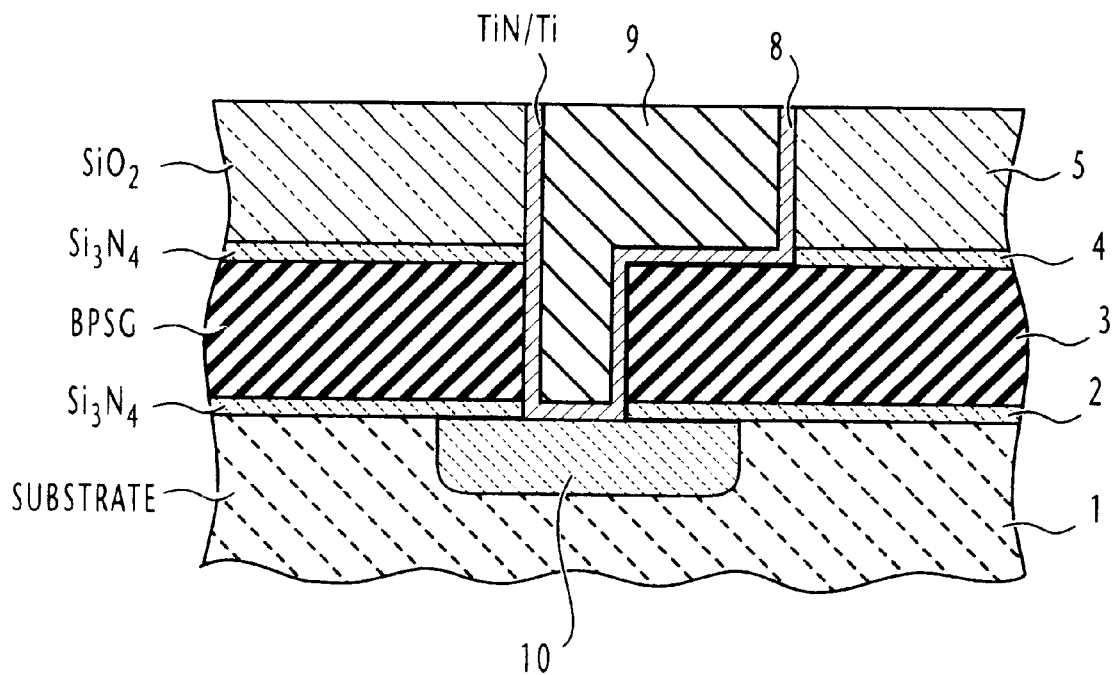

Chem-mech polishing technique is then used to remove an overfilled metal layer 9 and the thin film 8 to reveal the upper insulating layer 5 so that the surfaces the upper insulating layer 5 and the metal 9 are coplanarized as shown in FIG. 9.

What is claimed is:

1. A method of fabricating a semiconductor structure, comprising the steps of:
   a) providing a substrate having a doped region;
   b) forming a successively layered structure on said substrate, the layered structure comprising a lower insulating layer, a lower etch stop layer, an upper insulating layer and an upper etch stop layer;
   c) forming a via hole above said doped region, the via hole extending through the upper etch stop layer and the upper insulating layer to the lower etch stop layer;
   d) forming, on said upper etch stop layer, a photoresist layer having a trench pattern;
   e) forming a replica of said trench pattern on the upper etch stop layer;
   f) removing any of said photoresist layer;
   g) simultaneously removing a portion of the upper insulating layer through said replica of said trench pattern to form a wire trench and a portion of the lower insulating layer through the removed portion of said lower etch stop layer to extend said via hole to said doped region;
   h) simultaneously removing the upper etch stop layer and a portion of the lower etch stop layer through said wire trench; and
   i) depositing metal in said via hole and said wire trench.

2. The method of claim 1, wherein the upper etch stop layer has a thickness greater than a thickness of said lower etch stop layer.

3. The method of claim 1, wherein the upper etch stop layer is more etch-tolerant than said lower etch stop layer.

4. The method of claim 1, wherein the step (c) comprises forming said via hole so that the via hole extends partially into said lower insulating layer.

5. The method of claim 1, wherein the step (i) comprises the steps of:
   coating the layered structure attained by the step (h) with a thin film of first metal;
   depositing a layer of second metal over the coated layered structure; and
   removing a portion of the layer by a chemical-mechanical polishing technique to coplanalize the surfaces of the upper insulating layer and the metal deposited in said wire trench.

6. The method of claim 5, wherein said first metal comprises titanium or titanium nitride and said second metal comprises tungsten.

7. A method of fabricating a semiconductor structure, comprising the steps of:

a) providing a substrate having a doped region;

b) forming a successively layered structure on said substrate, the layered structure comprising a lower etch stop layer, a lower insulating layer, a middle etch stop layer, an upper insulating layer and an upper etch stop layer;

c) forming a via hole above said doped region, the via hole extending through said the upper etch stop layer, the upper insulating layer to the middle etch stop layer;

d) forming, on said upper etch stop layer, a photoresist layer having a trench pattern;

e) forming a replica of said trench pattern on the upper etch stop layer;

f) removing any of said photoresist layer;

g) simultaneously removing a portion of the upper insulating layer through said replica of said trench pattern to form a wire trench and removing a portion of the lower insulating layer through the removed portion of said middle etch stop layer to extend said via hole to said lower etch stop layer;

h) simultaneously removing the upper etch stop layer, a portion of the middle etch stop layer through said wire trench and a portion of the lower etch stop layer through said via hole; and i) depositing metal in said via hole and said wire trench.

8. The method of claim 7, wherein the upper etch stop layer has a thickness greater than a thickness of said lower etch stop layer.

9. The method of claim 7, wherein the upper etch stop layer is more etch-tolerant than said lower and middle etch stop layers.

10. The method of claim 7, wherein the step (c) comprises forming said via hole so that the via hole extends partially into said lower insulating layer.

11. The method of claim 7, wherein the step (i) comprises the steps of:

coating the layered structure attained by the step (h) with a thin film of first metal;

depositing a layer of second metal over the coated layered structure; and removing a portion of the layer by a chemical-mechanical polishing technique to coplanalize the surfaces of the upper insulating layer and the metal deposited in said wire trench.

12. The method of claim 11, wherein said first metal comprises titanium or titanium nitride and said second metal comprises tungsten.

* * * * *